United States Patent [19]

Bennett

[11] 3,965,420
[45] June 22, 1976

[54] APPARATUS FOR NON-DESTRUCTIVELY TESTING THE VOLTAGE CHARACTERISTICS OF A TRANSISTOR

[75] Inventor: Wilfred Potter Bennett, Belle Mead, N.J.

[73] Assignee: RCA Corporation, New York, N.Y.

[22] Filed: Dec. 16, 1974

[21] Appl. No.: 533,346

[52] U.S. Cl. .......................... 324/158 T; 324/158 D
[51] Int. Cl.² ......................................... G01R 31/22
[58] Field of Search ......... 324/158 T, 158 D, 158 R

[56] References Cited
UNITED STATES PATENTS

| | | | |
|---|---|---|---|
| 3,054,954 | 9/1962 | Boscia et al. | 324/158 T |
| 3,371,276 | 2/1968 | Schiff | 324/158 T |
| 3,401,338 | 9/1968 | Bolvin | 324/158 T |
| 3,535,639 | 10/1970 | Lunden | 324/158 T |

Primary Examiner—James B. Mullins
Assistant Examiner—Ernest F. Karlsen
Attorney, Agent, or Firm—Edward J. Norton; William Squire

[57] ABSTRACT

A non-destructive test apparatus includes current limiting means whose current conducting level is set according to the transistor characteristics under test. The current limiting means is in series with the collector-emitter electrodes of the transistor under test. A test voltage is placed across the series-connected current limiting means and test transistor. The test transistor is rendered non-conductive in accordance with the characteristics being tested. If the transistor enters a voltage breakover region known as "snap-back," destructive failure of the transistor is imminent causing a change in voltage across the current limiting means. Upon this change in voltage being sensed, destructive power is directed away from the transistor under test.

9 Claims, 4 Drawing Figures

U.S. Patent   June 22, 1976   3,965,420
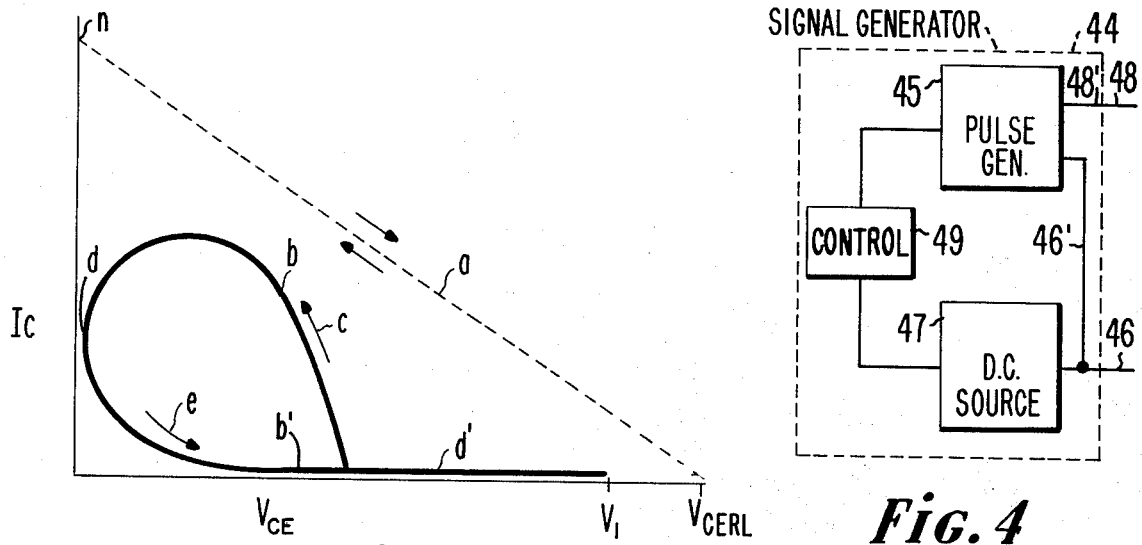
Fig.1
Fig.4
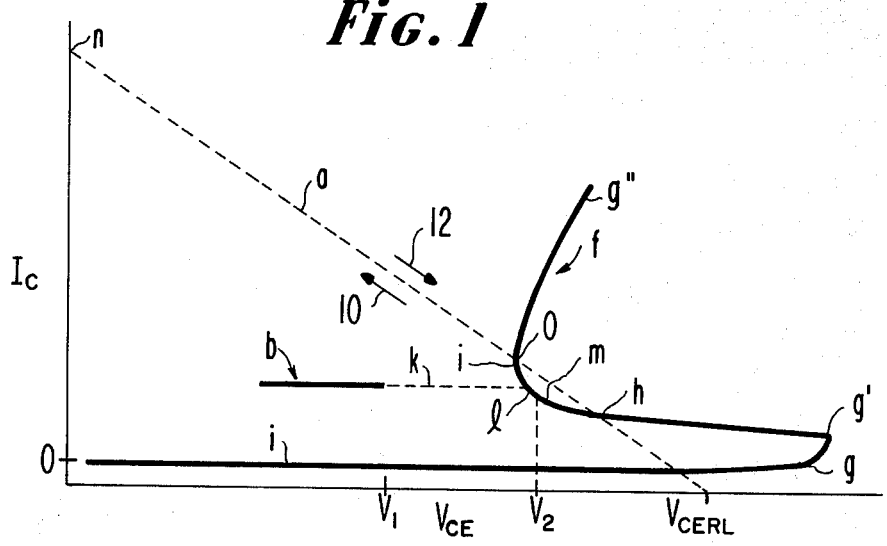
Fig.2
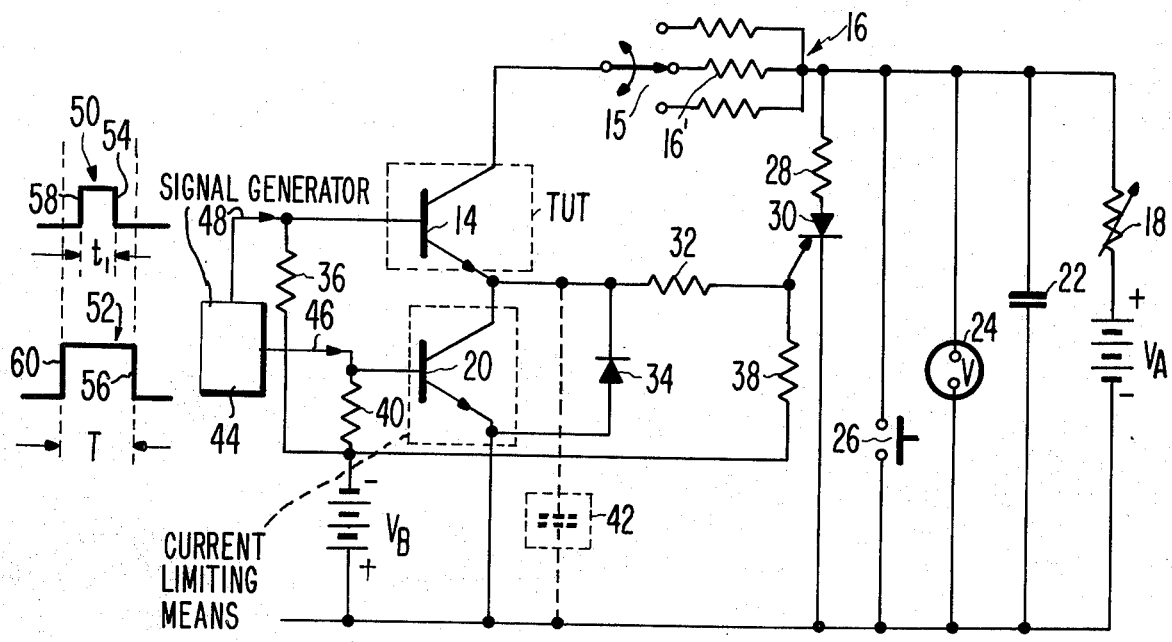
Fig.3

APPARATUS FOR NON-DESTRUCTIVELY TESTING THE VOLTAGE CHARACTERISTICS OF A TRANSISTOR

BACKGROUND OF THE INVENTION

1. Field of the Invention

The present invention relates to apparatus for non-destructively testing a transistor to determine the voltage the transistor can support when interrupting current flow.

2. Description of the Prior Art

Prior apparatus typically utilizes curve tracing circuits for examining transistors in the avalanche and voltage breakover regions. Such apparatus does not preclude the destructive failure of transistors whose voltage support capability has been exceeded.

When a transistor is open circuit tested, a voltage of increasing value is applied across the collector-emitter terminals until a predetermined maximum value is reached or the transistor enters voltage breakover at which time the transistor goes into a destructive failure mode.

When a transistor is operated in the dynamic state, it is desirable to determine whether or not the transistor can be operated with a given load resistance. A load line curve for such a transistor with a resistive load is given by a straight line plot of collector current versus collector-emitter voltage. However, the fact that the load line maximum voltage $V_{CERL}$ is less than the maximum voltage at which breakover occurs for a given transistor at zero current does not necessarily mean that the transistor will not exhibit breakover when operated with that load resistance at some finite current. None of the prior art test devices determine whether a given transistor, when operated under a given load resistance at low currents, will or will not experience breakover when subject to a given voltage at a given current without tending to destroy the transistor.

SUMMARY OF THE INVENTION

An apparatus is provided for testing a transistor having a pair of main electrodes and a control electrode. Current limiting means are connected to one of the main electrodes in a manner to permit a test voltage to be applied across the serially connected main electrodes and the current limiting means. When the transistor reaches its maximum voltage supporting limit, breakover of the transistor causes an increasing potential to appear at the one main electrode. Means are provided for sensing the increasing potential and for removing the test voltage from the main electrodes upon the occurrence of voltage breakover to prevent destructive failure of the transistor which might otherwise occur.

IN THE DRAWINGS

FIGS. 1 and 2 are graphs of waveforms useful in explaining the present invention, FIG. 3 is a schematic diagram of a circuit constructed in accordance with an embodiment of the present invention, and FIG. 4 is a schematic diagram of one embodiment of the signal generator shown in FIG. 3.

DETAILED DESCRIPTION

In FIG. 1, two load line curves (a) and (b) are illustrated. Curve (a) represents the straight line curve for a transistor turned on and off in a circuit having a fixed resistive impedance. Curve (b) represents a switching transistor turned on and off in a circuit having a complex impedance. Both curves illustrate a dynamic state of a transistor. By dynamic state is meant a state where a transistor is on or conductive and then is rendered non-conductive.

In curve (a), a transistor in a resistive load circuit has negligible voltage $V_{CE}$ across the emitter-collector electrodes and maximum collector current $I_C$ at point (n) when conducting. When turned off and rendered non-conductive, the transistor voltage $V_{CE}$ and collector current $I_C$ follow curve (a) until a maximum voltage $V_{CERL}$ is reached at negligible current $I_C$.

In curve (b), when the transistor is turned on, $I_C$–$V_{CE}$ follows the path in the direction of arrow (c), and when switched off at (d), $I_C$–$V_{CE}$ follows the path shown by arrow (e). When the collector current $I_C$ has been reduced to a very low level, as at (b'), the voltage across the collector-emitter electrodes $V_{CE}$ increases to some maximum voltage $V_1$.

On the other hand, an open circuit transistor is one in which the transistor is always non-conductive, i.e., reversed biased. In this case, the transistor, i.e., the charge carriers in the device, exhibits different characteristics than a transistor in the dynamic state as will be explained.

In FIG. 2, there is shown an enlarged out of scale representation of an open circuit characteristic curve (i), and also curves (a) and (b). As seen by curve (i) in FIG. 2, no current $I_C$ is flowing until poing (g) is reached at which time the transistor begins to conduct and enters the avalanche region between points (g) and (g'). In this region a slight increase in $V_{CE}$ results in a relatively large increase in $I_C$.

When some current $I_C$ is reached at g', the transistor enters a voltage breakover region between (g') and (g''). This is sometimes referred to in this art as snapback. In the voltage breakover region, the voltage $V_{CE}$ rapidly collapses with relatively no change in current. The curve (f) hereinafter will refer to the breakdown portion of curve (i) between points (g) and (g''). Curve (f) intercepts the load line curve (a) at point (h) and continues to exhibit a rapid decrease in $V_{CE}$ and relatively little change in $I_C$ until a change in characteristics is noted at (m). At this time, the voltage $V_{CE}$ increases again accompanied by a rapid increase in current $I_C$. Curve (f) again intersects curve (a) at (o) as the current $I_C$ increases. Curve (f) represents the maximum voltage $V_{CE}$ that a transistor can withstand for a given current $I_C$. As a result, curve (f) between (g') and (g'') defines a locus of breakover points of a transistor for a given $V_{CE}$ and $I_C$.

A breakover point, in the volt-ampere characteristic of a transistor, occurs when he differential (or incremental) resistance exhibited by the transistor sharply changes from a positive value through zero to a negative value. The breakover current is the value of current at the breakover point. This point which signifies a discontinuity in the transistor characteristics indicates an instability and, thus a change from one state of operation to another within the transistor. Accompanying the transistion from one state to another there can be a drastic change (increase) in the power level at which the transistor is operating. This drastic increase in the power flow into the transistor can, and often does, destroy or permanently degrade the transistor unless a very rapid and effective means of preventing this power flow is brought about. The likelihood of damage to the transistor is augmented in that at the breakover point the transistor is often already in a state of operation where power dissipation is concentrated in very localized volumes of the transistor structure with resultant high temperature regions, which may already be approaching the point of destruction or near the level at which an irreversible change in the structure of the transistor is about to occur.

It is important in characterizing a transistor's capabilities to identify the location or locus of the breakover points or at least to identify regions of operation which are free of these breakover points and the severe negative resistance portions of the characteristics associated with a breakover point.

A transistor may enter the breakover region in several ways. First, in an open circuit configuration, a transistor may be exposed to some voltage greater than the voltage $V_{CE}$ at $(g)$. Secondly, in the dynamic state, a transistor may be caused to experience a combination of $I_C$ and $V_{CE}$ which intercept the breakover region between points $(g')$ and $(g'')$. If this happens, then the transistor although biased off, will because of the characteristics of the device's charge carriers, tend to latch on in the couductive state in the region defined by curve $(f)$ between points $(g')$ and $(g'')$.

For example, let a transistor be tested in a circuit producing a straight line resistive load line as represented by curve $(a)$. When the transistor is turned on, the current goes from a very low current at $V_{CERL}$ to a very high current at $(n)$ along curve $(a)$ as shown by arrow 10. The current and voltage relationships, although intersecting curve $(f)$ continue along curve $(a)$ in the direction of arrow 10 until the maximum current $I_C$ is reached at $(n)$.

When the transistor is at a maximum current, $(n)$, and the transistor is then switched off, the load line curve $(a)$ follows arrow 12. The collector-emitter voltage $V_{CE}$ increases as the current $I_C$ decreases until curve $(a)$ intersects curve $(f)$ at $(0)$. With the base drive removed from the transistor in an attempt to render the transistor non-conductive, the transistor latches at point $(0)$ and tends to remain in the conductive state, thus remaining in the breakover region. As a result, two things occur; first, the transistor does not turn off and therefore fails to perform in its intended function; secondly, the voltage across the transistor-collector-to-emitter electrodes tends, with the current at point $(0)$, to destroy the transistor by following curve $(f)$ to $(g'')$.

In a similar manner, regardless of the load line characteristics as illustrated by curve $(b)$, a transistor in the dynamic state, if when rendered non-conductive experiences a combination of $V_{CE}$–$I_C$ which intercept curve $(f)$, then the transistor may fail. As an illustration, if curve $(b)$ did not terminate at $V_{CE}$ of $V_1$ but at $V_2$ instead, it is seen that curve $(b)$ when extended at $(k)$ intercepts curve $(f)$ at $(1)$. Once this occurs, the transistor producing curve $(b)$ will latch on and follow curve $(f)$ toward point $(g'')$. This action may cause the transistor to destructively fail.

Therefore, it is important to know the locus of points constituting the breakdown region of curve $(f)$. This can be accomplished in two manners; open circuit testing the transistor with a given resistive load to produce curve $(i)$ and also testing the dynamic characteristics by subjecting a transistor to an on condition and then rendering the transistor non-conductive. In this manner, point $(g')$ can be determined in the open circuit test and the portion of curve $(f)$ between points $(o)$ and $(h)$ in the dynamic test. In accordance with the present invention, an apparatus is provided which will non-destructively test a transistor for voltage breakover.

To test a transistor for maximum voltage capability as manifested by curve $(f)$ along a load line curve $(a)$ for a given load resistance, and for open circuit testing of the transistor for the location of point $(g')$, the circuit of FIG. 3 is provided. In FIG. 3, the collector-electrode of the transistor 14 under test (TUT) is selectively connected by switch 15 through one of a range of load resistances 16 and through a variable current limiting resistance 18 to the positive terminal of a voltage supply $V_A$. It is to be understood that a socket or transistor receiving receptacle (not shown) is connected for receiving the respective electrodes of transistor 14 of FIG. 3. In this manner, a transistor under test 14 is merely inserted into the socket (not shown) for conducting the test and after the test a different transistor may then be inserted and tested. The emitter-electrode of the transistor 14 under test is serially connected through the collector-emitter electrodes of transistor 20 to the negative terminal of voltage supply $V_A$. Transistor 20 serves as a controllable current limiting means in a manner to be explained.

Storage capacitor 22 is connected across variable resistance 18 and voltage supply $V_A$ to provide a constant voltage during the duration of the test. Across the storage capacitor 22 is connected a suitable voltmeter 24. Also across capacitor 22 is a suitable pushbutton switch 26. Serially connected across switch 26 is a current limiting resistor 28 and SCR 30 whose anode is connected to resistor 28 and whose cathode is connected to the negative terminal of supply $V_A$. The gate of SCR 30 is connected to the junction of the emitter of transistor 14 and collector of transistor 20 through a current limiting resistor 32.

Across the collector-emitter electrodes of transistor 20 is a diode 34 whose anode is connected to the emitter of transistor 20. The base electrode of transistor 14 is connected to the gate of SCR 30 through serially connected base-emitter biasing resistor 36 and SCR biasing resistor 38. Resistor 36 is the base-emitter bias resistor for transistor 14, while resistor 38 is the bias resistance for the gate of SCR 30. A resistor 40 is connected between the base of transistor 20 and the negative terminal of a supply $V_B$. Resistor 40 is the base-emitter bias resistance of transistor 20. The junction of resistances 36, 38 and 40 is connected to the negative terminal of the biasing voltage supply $V_B$, whose positive terminal is connected to the emitter of transistor 20. Supply $V_B$ is the reverse bias supply for transistors 14 and 20. Shown dotted is stray capacitance 42 which is present in the circuit of FIG. 3. Capacitance 42 exists between the emitter of the transistor under test 14 and the negative terminal of voltage supply $V_A$ and positive terminal of supply $V_B$.

Signal generator 44 has two outputs 46 and 48. One output 48 is connected to the base electrode of transistor 14 while the other output 46 is connected to the base electrode of transistor 20. Generator 44 is a direct current (D.C.) device which produces on outputs 46 and 48 either a preset level signal or pulses of predetermined width and timing. That is, internal to generator 44 are at least two independent signal generating circuits.

In FIG. 4, signal generator 44 is shown as including a circuit 45 which is a pulse generator and a circuit 47 which is a D.C. source. Pulse generator 45 has two outputs 46' and 48' which are respectively connected to corresponding outputs 46 and 48. The D.C. source 47 has an output connected to output 46. A control 49 which may be a suitable switch selectively turns on either generator 45 or source 47 in accordance with a given test.

Pulse generaor 45 is a conventional pulse generator which generates pulses on outputs 46 and 48 when switched on by control 49. Generator 45 may include two pulse generating circuits (not shown). Generator 45 further includes means for timing the output of one of the two pulse generating circuits (not shown) with the other pulse generating circuit (not shown). This can be accomplished by feeding the output of one of the pulse generating circuits as an input to the other pulse generating circuits so that the one circuit serves as a timing source for the other circuit. These circuits and the coupling thereof in the manner described are conventional. Therefore, signals may be provided on outputs 46 and 48 wherein pulses of given timing appear on both outputs. Additionally, means are included in generator 45 by which the pulses on each output may be independently varied in time duration or amplitude relative to the pulses on the other output.

The D.C. source 47 provides a direct current of a predetermined value on output 46. Control 49 turns on source 47 and shuts off generator 45. As a result, no signal appears on output 48 when source 47 is switched on. Source 47 includes means for selectably setting the value of the direct current appearing on output 46.

The test thus includes setting the time, pulse width as applicable and signal amplitude level on each output 46 and 48 in accordance with a given test. The given test is determined by which point on curve (f) FIG. 2, is being examined with respect to a transistor 14 under test.

In operation a load resistance is selected, for example, resistance 16', by selector switch 15. A supply voltage $V_A$ is selected anywhere within a suitable range of 0 to 1000 volts by the setting of variable resistance 18. Switch 26 is momentarily closed to assure SCR 30 is in the off condition.

Assume that curve (a) of FIG. 2 is provided by the circuit of FIG. 3. Further assume that the transistor 14 under test has a maximum voltage characteristic described by curve (f). Both transistors 14 and 20 are reverse biased by voltage $V_B$. Reverse bias for transistor 14 is achieved through resistor 36, voltage supply $V_B$ and diode 34 to the emitter of transistor 14. Reverse bias for transistor 20 is achieved through the biasing resistor 40, voltage supply $V_B$ to the emitter-electrode of transistor 20. It is to be noted that diode 34 is poled to conduct a reverse bias current to transistor 14 and will not pass the collector-emitter current of transistor 14 when conductive.

To test a transistor 14 in the dynamic state, the test is to determine whether or not transistor 14, when operated in a circuit having a load resistance of a magnitude of resistance 16' will be able to support a maximum voltage $V_{CERL}$. In this case, the transistor is placed initially on and then turned off in a manner to be described. If the transistor load line curve (a) does in fact intercept the curve (f) for that transistor such as at point (0), then it is known that the transistor will not support a maximum voltage $V_{CERL}$ in its intended environment in a circuit of that resistance. As provided by the apparatus of the present invention, should the transistor experience voltage breakover as at point (0), then the transistor is protected from destructive failure and may be used in a less severe environment.

In FIG. 3, generator 44 is set to generate pulses 50 and 52 on respective outputs 48 and 46 in the dynamic test. Pulses 50 and 52 are of particular significance. Pulse 52 has a time period T which is longer in duration than the time period t of pulse 50. The leading edge 54 of pulse 50 commences after the occurrence of the leading edge 56 of pulse 52. During period T the trailing edge 58 of pulse 50 occurs prior to the occurrence of the trailing edge 60 of pulse 52. Therefore, the time duration of period T of pulse 52 is greater than the time duration t of pulse 50. The time difference between the trailing edges of pulses 50 and 52 is approximately the storage time of the transistor 14 under test.

To start the test, pulses 50 and 52 are applied respectively to the bases of transistors 14 and 20 in the time relationship illustrated in FIG. 3 by setting generator 44 accordingly. This relationship is set into generator 44 in a conventional manner. As a result, transistor 20 is conducting prior to the transistor 14 being turned on. With transistor 20 in the on condition, pulse 50 is then applied by generator 44 to the base of transistor 14 driving transistor 14 into a saturated conductive state for the duration of pulse 50. At the end of pulse 50 the removal of this pulse from the base electrode of transistor 14 tends to render transistor 14 non-conductive.

As illustrated in FIG. 2, assuming curve (a) is the load line of the circuit selected, the load line voltage-current characteristic curve (a) of transistor 14 and resistance 16' traverse in the direction of arrow 12 until the load line curve (a) intersects curve (f) at (o). When this occurs, transistor 14 latches in the conductive state even though the base drive signal provided by pulse 50 will have disappeared and transistor 14 is in a reversed bias condition. Meanwhile, transistor 20 is still conducting due to the time differential existing between trailing edges 58 and 60. The current through transistors 14 and 20 will remain the same as if pulse 50 were still applied to the base electrode of transistor 14. However, at the end of the pulse 52, when transistor 20 is rendered non-conductive by the reverse bias condition, transistor 14 tends to continue to conduct through the stray capacitance 42 of the circuit of FIG. 3. This continual conduction at this time will result in a continuing current depicted by curve (f) between (o) and (g'') of FIG. 2. This continuing current tends to destroy transistor 14 unless otherwise provided for.

SCR 30 and associated circuitry are provided to prevent such destruction. With transistor 14 still conducting and transistor 20 turned off, the potential at the emitter-electrode of transistor 14 tends to rapidly increase due to the sudden presence of the impedance presented by transistor 20 when transistor 20 is rendered non-conductive. This increase in potential is sensed by the gate of SCR 30 which triggers on SCR 30 into conduction. At this time, the current from voltage supply $V_A$ originally applied to transistor 14 is in effect diverted through resistance 28 and SCR 30. Thus, the destructive currents that might otherwise flow through the collector-to-emitter path of transistor 14 are diverted upon the sensing of the breakdown condition of transistor 14. All this action occurs within a few microseconds. The transistor 14 can thus be salvaged for other applications which require a different load line characteristic curve (a).

To test a transistor in the open circuit configuration to identify the location of points (g) and (g''), generator 44 is reset to apply a different set of signals to transistors 14 and 20. In particular, a D.C. base drive is applied to the base of transistor 20 by way of output 46. The level of the base drive signal to transistor 20 is selected in accordance with the current $I_C$ to be carried by the transistor under test. The initial circuit conditions are established so that transistor 20 serves as a current source conducting a given current, for example, a current of about 20 milliamps. If an attempt is made to increase the current through the transistor 20, then the potential at the collector-electrode of this transistor tends to rise. It is to be understood that the transistor 20 operates in a family of curves at different currents $I_C$ in accordance with the level of the base drive signal supplied. Therefore, this base drive level is predetermined in accordance with the characteristics of the transistor under test. Also, while the transistor 20 is shown in a common emitter connection, it can serve as a current limiter equally in a common base configuration. The transistor 14 under test may also be arranged in alternative configurations in addition to the reverse bias arrangement. In these arrangements the base may be shorted to the emitter electrode or connected to the emitter electrode through a resistance known as $V_{CES}$ and $V_{CER}$ modes, respectively. Also, other $V_{CER}$ modes may ve used in addition to the arrangement of FIG. 3a in which the base is connected to the emitter through a resistance and a battery.

If a breakover occurs in transistor 14, as at point (g'), FIG. 2, transistor 14 will attempt to pass increased current above the exemplary 20 milliamps limited by transistor 20. At this time the voltage across transistor 20 will immediately rise and trigger SCR 30 via the gate thereof. Therefore, as provided by the present invention, a controllable impedance is disposed between the emitter-electrode of transistor under test 14 and the system ground exemplified by the negative terminal of supply $V_A$. This impedance is one which is arranged to pass a predetermined current. If, and when, the transistor 14 does breakover and attempts to pass more current than the predetermined current limited by the controllable impedance exemplified by transistor 20, the potential at the emitter-electrode of the transistor under test will immediately rise. This increased potential is sensed by the SCR 30 which diverts the power away from the transistor under test. This diverting of power prevents excess currents from being drawn through transistor 14 and the possible resultant destructive failure thereof.

What is claimed is:

1. An apparatus for testing the voltage characteristics of a transistor having a pair of main electrodes and a control electrode, said transistor being of a type tending to conduct a destructive certain current when the voltage at the main electrode exceeds a given level, the apparatus comprising:

settable current limiting means having a current limiting value settable anywhere in a given range,
means for connecting one of said main electrodes to said current limiting means,
means for applying a test voltage across the serially connected main electrodes and current limiting means,
said current limiting means being responsive to a control signal having a predetermined value applied as an input thereto for setting the current limiting value of said current limiting means within said range to thereby result in a potential increase at said one main electrode when said certain current occurs at said main electrodes,
preprogrammed signal generating means coupled to said current limiting means for determining the value of said control signal and for applying said control signal to said current limiting means, and
voltage sense means responsive to said potential increase at said one main electrode for removing the test voltage from said main electrodes.

2. The apparatus of claim 1 wherein said signal generating means is coupled to said control electrode, said signal generating means including means for generating first and second control signals and applying said first and second signals respectively to said control electrode and said current limiting means for rendering each said transistor and said current limiting means successively conductive and then non-conductive in a given sequence.

3. The apparatus of claim 2 wherein said first signal renders said transistor conductive only when said current limiting means is rendered conductive.

4. The apparatus of claim 1 further including means for maintaining said transistor non-conductive, said signal being programmed to generate means generating a control signal for causing said current limiting means to conduct a current less than said certain current.

5. The apparatus of claim 1 wherein said current limiting means includes a second transistor having a pair of main electrodes and a control electrode, the main electrodes of each of said transistors being serially connected, the control electrode of said second transistor being coupled to said signal generating means for receiving said applied control signal.

6. The apparatus of claim 5 wherein said signal generating means produces a programmable D.C. signal for causing said second transistor to conduct a current less than said certain current.

7. The apparatus of claim 5 wherein said signal generator generates first and second signals, said apparatus further including means for reverse biasing said test and second transistors, said first and second signals rendering said test and second transistors conductive in accordance with a given sequence.

8. The apparatus of claim 1 wherein said voltage sense means is an SCR having a pair of main electrodes and a gate electrode, said gate electrode being coupled to said one main electrode, said SCR main electrodes being coupled across the serially connected main electrodes of said transistor and said current limiting means, said gate electrode being responsive to said potential increase at said one main electrode.

9. The apparatus of claim 1 wherein said test voltage applying means includes means for varying said test voltage.

\* \* \* \* \*